United States Patent
Kajitani

(10) Patent No.: US 7,619,939 B2
(45) Date of Patent: Nov. 17, 2009

(54) SEMICONDUCTOR STORAGE APPARATUS

(75) Inventor: Yasuyuki Kajitani, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 11/950,732

(22) Filed: Dec. 5, 2007

(65) Prior Publication Data
US 2008/0130389 A1  Jun. 5, 2008

(30) Foreign Application Priority Data
Dec. 5, 2006  (JP) .............................. 2006-328585

(51) Int. Cl.
*G11C 7/00* (2006.01)
(52) U.S. Cl. .................. 365/203; 365/196; 365/202; 365/207; 365/189.04; 365/191
(58) Field of Classification Search ................. 365/203, 365/196, 202, 207, 189.04, 191
See application file for complete search history.

(56) References Cited

U.S. PATENT DOCUMENTS 6,449,204 B1 * 9/2002 Arimoto et al. ............. 365/222
7,177,215 B2   2/2007 Tanaka et al.

FOREIGN PATENT DOCUMENTS

JP         2004-87074         3/2004

* cited by examiner

*Primary Examiner*—Thong Q Le
(74) *Attorney, Agent, or Firm*—Oblon, Spivak, McClelland, Maier & Neustadt L.L.P.

(57) ABSTRACT

A cell array selection circuit, a cell array bit line precharge circuit, and a sense amplifier bit line precharge circuit are provided in a semiconductor storage apparatus. In a standby state of read/write operation, the cell array selection circuit is controlled to an inactive state, and the bit line precharge circuits are controlled to an active state. In an active state of read/write operation, the cell array selection circuit to be selected is controlled to an active state, and the cell array bit line precharge circuit and the sense amplifier bit line precharge circuit are controlled to an inactive state. Cell array selection transistors, sense amplifier bit line precharge transistors, and control signals supplied to gate electrodes of the transistors are set in which change in potential provided on a cell array bit line pair when the states of the transistors change is cancelled.

20 Claims, 6 Drawing Sheets

| | Conventional art | Embodiment |
|---|---|---|
| Transistor size (Tr size) | 4.0 μm | 1.5 μm (Q13,Q23) 0.5 μm (Q33) |
| Precharge time | 1.6nS | 1.0nS |
| Falling noise | 170mV | 30mV |

SEMICONDUCTOR STORAGE APPARATUS

CROSS-REFERENCE TO RELATED APPLICATIONS

This application is based upon and claims the benefit of priority from prior Japanese Patent Application No. 2006-328585, filed Dec. 5, 2006, the entire contents of which are incorporated herein by reference.

BACKGROUND OF THE INVENTION

1. Field of the Invention

The present invention relates to a semiconductor storage apparatus, in particular, peripheral circuits of a bit line sense amplifier, used for general-purpose DRAMs, and embedded DRAMs.

2. Description of the Related Art

Increase in performance is always required for semiconductor memory devices, such as Dynamic Random Access Memory (DRAM), and increase in speed of random access is required. To increase the speed of random access, it is necessary to also increase the speed of precharge of bit lines, and increase the size of transistors for bit line precharge. This has a large influence on reading operation of a bit line sense amplifier, and may cause malfunction. This point is explained below.

FIG. 1 illustrates a structure of a part of a conventional DRAM adopting a shared sense amplifier of the folded bit line scheme, in which a bit line sense amplifier SA is shared between cell arrays provided on left and right sides thereof. FIG. 1 illustrates only a pair of columns on right and left sides. FIG. 2 illustrates an example of a main part of signal waveform in data reading operation in the DRAM of FIG. 1. In FIG. 2, VPP denotes an "H" level potential of a word line, VBLH denotes an "H" level potential of a bit line, VBLL (normally VSS) denotes an "L" level potential of a bit line, VBL (normally VBLH/2) denotes a bit line precharge potential, and VDD denotes a power potential of a peripheral logic circuit.

In the circuit of FIG. 1, when the circuit is in a standby state (bit line precharge period), cell array selection signals MUXL and MUXR are VPP, and cell array selection transistors QSL, /QSL, QSR, and /QSR are in an ON state. Next, when reading operation of the cell array located on the left side of the sense amplifier SA is performed, the potential of the cell array selection signal MUXR is changed to VPP to VSS, and thereby the right cell array is electrically disconnected from the sense amplifier SA, and the left cell array is selected. Then, the potential of a control signal BLPL for precharge/equalizing transistors Q11 to Q13 which precharge a pair of bit lines BLL and /BLL of the selected left cell array is changed from VPP to VSS. Thereby, precharge of the bit lines BLL and /BLL is released. Thereafter, the potential of the word line WLL is changed from VSS to VPP, and data stored in the memory cells of the left cell array is read on the bit lines BLL and /BLL. After a certain time interval, the potential of an NMOS driver transistor activating signal SEN for the sense amplifier SA is changed from VSS to VBLH, and the potential of a PMOS drive transistor activating signal SEP for the sense amplifier SA is changed from VBLH to VSS. Thereby, the data read on the bit lines BLL and /BLL is amplified by the sense amplifier SA, and the potential of the "H" bit line in the bit lines BLL and /BLL is changed to VBLH, and the potential of the "L" bit line is changed to VSS. Thereafter, the potential of a column selection signal CSL of a CSL gate is activated from VSS to VDD, data of a pair of sense amplifier bit lines SBL and /SBL is transferred to a pair of data lines DQ and /DQ, and thereby reading is performed. In reverse to the above, writing is performed by transferring data of the data lines DQ and /DQ to the sense amplifier bit lines SBL and /SBL.

FIG. 3 is a diagram illustrating a signal waveform to explain an influence on reading operation when the size of bit line precharge/equalizing transistors is increased to increase the speed of the random access operation illustrated in FIG. 2. When bit line precharge is stopped, the potential of the bit lines BLL and /BLL directly before the word line WLL is activated is lower than the bit line precharge potential VBL, by the influence of noise which occurs in fall of the bit line precharge signal BLPL. When the size of bit line precharge/equalizing transistors is increased, noise which occurs in fall of the bit line precharge signal BLPL also increases as a matter of course. Therefore, the potential of the bit lines BLL and /BLL directly before the word line WLL is activated remarkably lowers. Thus, the difference in potential generated between the bit lines BLL and /BLL when data "0" of memory cells is read is reduced, and malfunction is caused.

As a measure against the above problem, it is considered to reduce noise which occurs in fall of the bit line precharge signal BLPL illustrated in FIG. 3 by providing rising noise reverse to the above noise. Specifically, as illustrated in FIG. 4, a PMOS transistor QP is connected in parallel with a bit line equalizing transistor Q13 of the cell arrays. Then, when precharge and equalizing of the bit lines are stopped, the PMOS transistor QP is changed from ON state to OFF state by a control signal BLPLa as illustrated in a signal waveform diagram of FIG. 5, and thereby rising noise is provided to the bit lines BLL and /BLL.

However, the above case has the following problem. Specifically, transistors having a thin gate oxide film are used as transistors forming the sense amplifier SA, for the purpose of increasing the operation speed thereof. In comparison with this, transistors having a thick gate oxide film are used as bit line precharge/equalizing transistors, since it is necessary to provide a high voltage not less than "bit line precharge potential VBL+the threshold of the transistors" to them as a gate potential. Further, transistors having a thick gate oxide film are used as cell array selection transistors, since it is necessary to provide a high voltage not less than "bit line high level potential VBLH+the threshold of the transistors" to them as the gate potential, to surely transfer a high level potential of the bit lines. Specifically, since no PMOS transistors having a thick gate oxide film are used in the conventional sense amplifier, if PMOS transistors having a thick gate oxide film are used together as bit line equalizing transistors as measures against noise, it is necessary to newly provide an area for providing the PMOS transistors, and it is feared that the area occupied by the bit line precharge circuit is increased.

Further, if reduction in the operation voltage proceeds, when the bit lines are precharged and equalized, the gate-source potential "VBL-VSS" of the bit line equalizing PMOS transistor QP is lowered. Therefore, it cannot be expected that the bit line equalizing PMOS transistor QP contributes to the bit line equalizing operation, and the bit line equalizing PMOS transistor QP is only used for providing noise to the bit lines. Thus, the efficiency of the transistor QP is very low.

FIGS. 13 and 14 of Jpn. Pat. Appln. KOKAI Pub. No. 2004-87074 disclose a semiconductor integrated circuit apparatus having a memory circuit of the hierarchical bit line scheme, in which increase in operation speed and reduction in power consumption are achieved by a simple structure. In the memory circuit, shared selection MOSFETs are provided between a sense amplifier circuit SA including a CMOS latch circuit and four pairs of complementary bit lines. In response to selection of a word line of any one of first to fourth memory mats, any one of first to fourth selection signals is changed to a selection level, and thereby one of the first to fourth selection switch MOSFETs is changed to ON state. Thereby, any one of first to fourth complementary bit line pairs is connected to a pair of input/output nodes of the sense amplifier, and a signal read from the dynamic memory cells is amplified. In this case, pair of precharge/equalizing MOSFETs which supply precharge voltage to the input/output nodes of the sense amplifier are connected to the input/output nodes during a precharge period. However, the invention disclosed in Jpn. Pat. Appln. KOKAI Pub. No. 2004-87074 does not refer to measures for reducing noise in active operation for cell arrays.

BRIEF SUMMARY OF THE INVENTION

According to a first aspect of the present invention, there is provided a semiconductor storage apparatus comprising: a memory cell array formed by arranging a plurality of memory cells in rows and columns; a cell array bit line pair which is provided for a column of the memory cell array, and connected to a plurality of memory cells of the column; a bit line sense amplifier which senses a potential of the cell array bit line pair; a sense amplifier bit line pair connected to the bit line sense amplifier; a cell array selection circuit which has a pair of transistors each having a gate electrode receiving a first control signal, the cell array selection circuit being connected between the cell array bit line pair and the sense amplifier bit line pair, and selectively connecting the cell array bit line pair and the sense amplifier bit line pair; a first precharge circuit which includes at least one transistor having the same conductivity type as that of the pair of transistors in the cell array selection circuit, and precharges and equalizes the cell array bit line pair, the at least one transistor having a gate electrode receiving a second control signal; a second precharge circuit which includes at least one transistor having the same conductivity type as that of the pair of transistors in the cell array selection circuit, and precharges and equalizes the sense amplifier bit line pair, the at least one transistor having a gate electrode receiving a third control signal; and a control signal generating circuit which generates the first, the second, and the third control signals, supplies the first, the second, and the third control signals to the cell array selection circuit, the first precharge circuit and the second precharge circuit, respectively, controls the cell array selection circuit to an inactive state and controls the first and the second precharge circuits to an active state in a standby state of read/write operation for the memory cell array, and controls the cell array selection circuit to an active state and controls the first and the second precharge circuits to an inactive state in an active state of read/write operation for the memory cell array.

According to a second aspect of the present invention, there is provided a semiconductor storage apparatus comprising: a first and a second memory cell arrays each being formed by arranging a plurality of memory cells in rows and columns; a first cell array bit line pair which is provided for each column of the first memory cell array, and connected to a plurality of memory cells of the column; a second cell array bit line pair which is provided for each column of the second memory cell array, and connected to a plurality of memory cells of the column; a bit line sense amplifier which is provided for the columns of the first and second memory cell arrays, and senses a potential of the first or second cell array bit line pair; a sense amplifier bit line pair connected to the bit line sense amplifier; a first cell array selection circuit which is connected between the first cell array bit line pair and the sense amplifier bit line pair, and selectively connects the first cell array bit line pair and the sense amplifier bit line pair; a second cell array selection circuit which is connected between the second cell array bit line pair and the sense amplifier bit line pair, and selectively connects the second cell array bit line pair and the sense amplifier bit line pair; a first precharge circuit which includes at least one transistor having the same conductivity type as that of a pair of transistors in the first cell array selection circuit, and precharges and equalizes the first cell array bit line pair; a second precharge circuit which includes at least one transistor having the same conductivity type as that of a pair of transistors in the second cell array selection circuit, and precharges and equalizes the second cell array bit line pair; and a third precharge circuit which includes at least one transistor having the same conductivity type as that of the pairs of transistors in the first and the second cell array selection circuits, and precharges and equalizes the sense amplifier bit line pair.

According to a third aspect of the present invention, there is provided a semiconductor storage apparatus comprising: a first and a second memory cell arrays each being formed by arranging a plurality of memory cells in rows and columns; a first cell array bit line pair which is provided for each column of the first memory cell array, and connected to a plurality of memory cells of the column; a second cell array bit line pair which is provided for each column of the second memory cell array, and connected to a plurality of memory cells of the column; a bit line sense amplifier which is provided for the columns of the first and second memory cell arrays, and senses a potential of the first or second cell array bit line pair; a sense amplifier bit line pair connected to the bit line sense amplifier; a first cell array selection circuit which has a pair of transistors each having a gate electrode receiving a first control signal, the first cell array selection circuit being connected between the first cell array bit line pair and the sense amplifier bit line pair, and selectively connects the first cell array bit line pair and the sense amplifier bit line pair; a second cell array selection circuit which has a pair of transistors each having a gate electrode receiving a second control signal, the second cell array selection circuit being connected between the second cell array bit line pair and the sense amplifier bit line pair, and selectively connects the second cell array bit line pair and the sense amplifier bit line pair; a first precharge circuit which includes at least one transistor having the same conductivity type as that of the pair of transistors in the first cell array selection circuit, and precharges and equalizes the first cell array bit line pair, the at least one transistor having a gate electrode receiving a third control signal; a second precharge circuit which includes at least one transistor having the same conductivity type as that of the pair of transistors in the second cell array selection circuit, and precharges and equalizes the second cell array bit line pair, the at least one transistor having a gate electrode receiving a fourth control signal; a third precharge circuit which includes at least one transistor having the same conductivity type as that of the pairs of transistors in the first and the second cell array selection circuits, and precharges and equalizes the sense amplifier bit line pair, the at least one transistor having a gate electrode receiving a fifth control signal; and a control signal generating circuit which generates the first, the second, the third, the fourth, and the fifth control signals, supplies the first, the second, the third, the fourth, and the fifth control signals to the first and the second cell array selection circuits, and the first, the second, and the third precharge circuits, respectively, controls the first and the second cell array selection circuits to an inactive state and controls the first, the second and the third precharge circuits to an active state in a standby state of read/write operation for the first and the second memory cell arrays, and controls one of the first and the second cell array selection circuits to an active state, the other to an inactive state, and controls the first, the second and the third precharge circuits to an inactive state in an active state of read/write operation for the first and the second memory cell arrays.

DETAILED DESCRIPTION OF THE INVENTION

Figure 1:
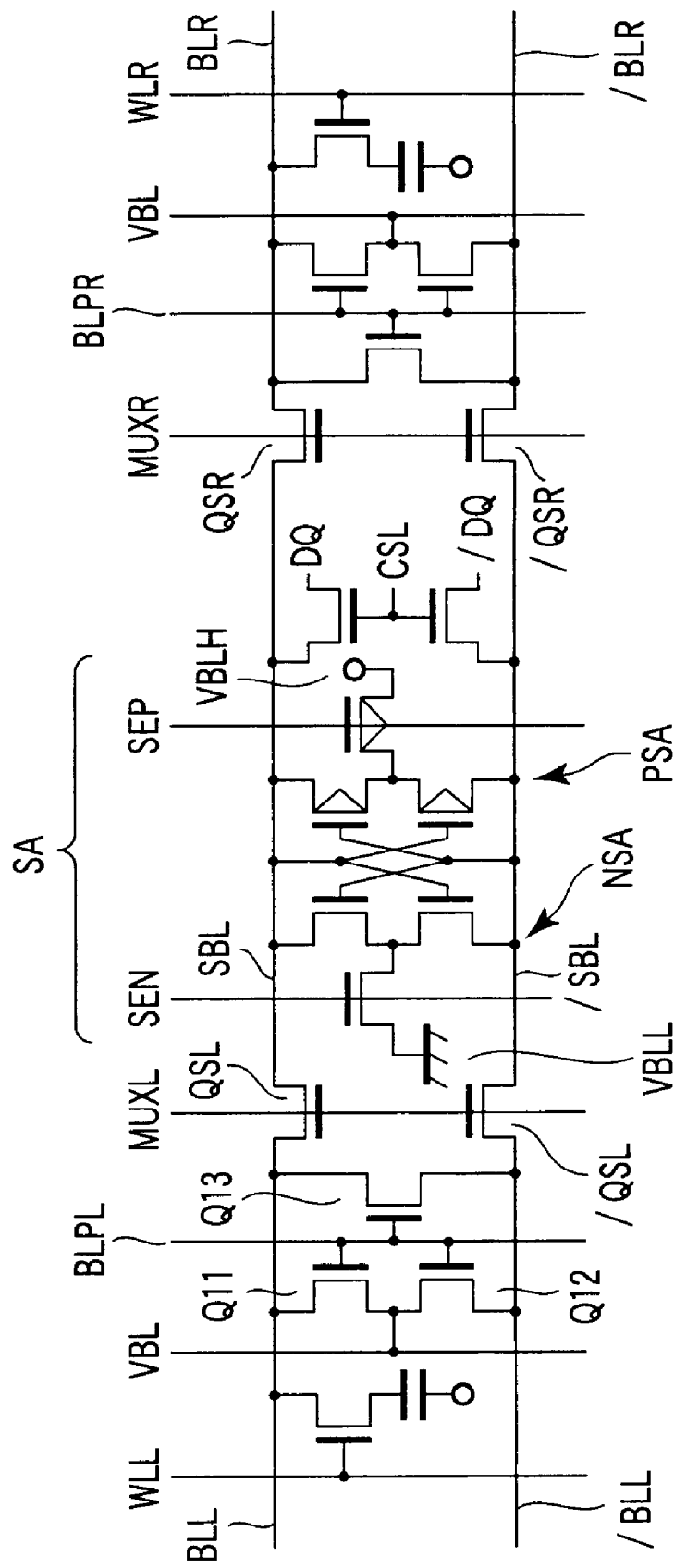
FIG. 1 is a schematic circuit diagram of a conventional DRAM.
Figure 2:
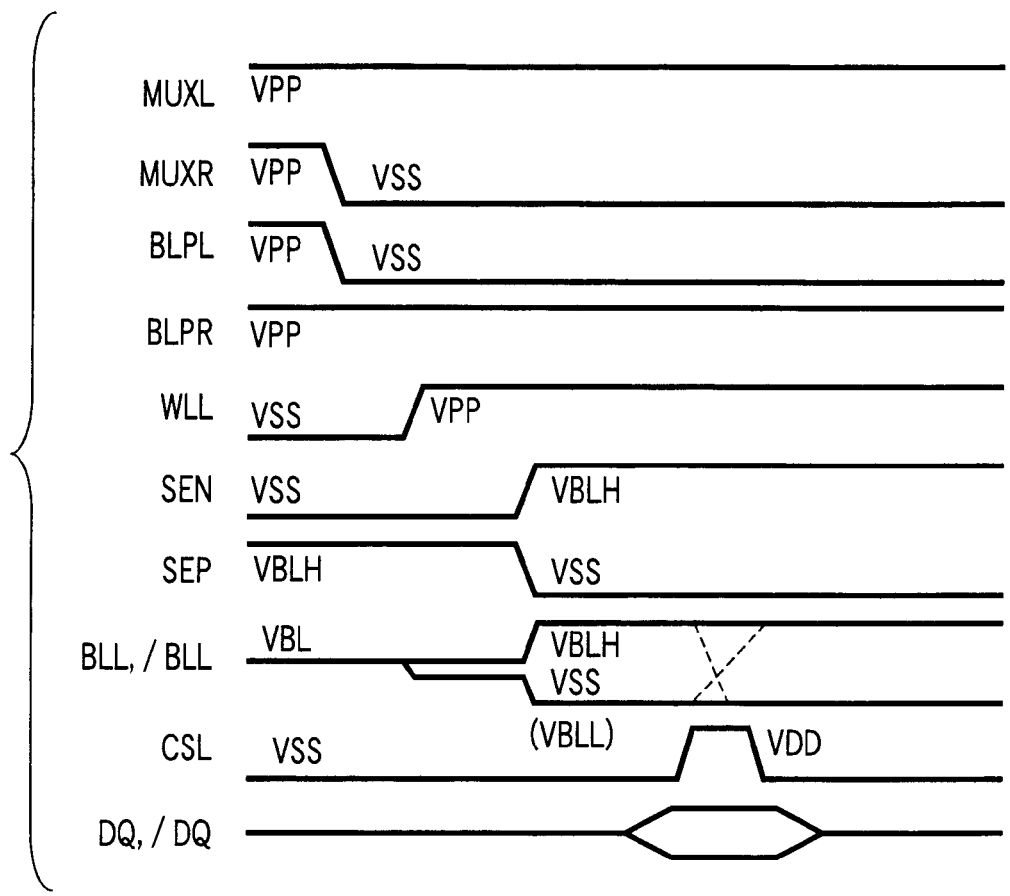
FIG. 2 is a signal waveform diagram in data reading operation in the DRAM of FIG. 1.
Figure 3:
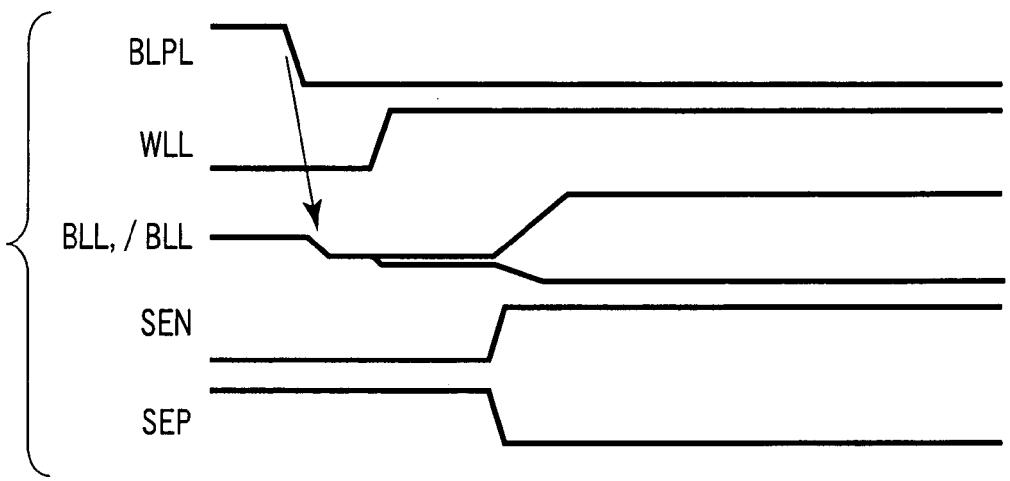
FIG. 3 is another signal waveform diagram in data reading operation in the DRAM of FIG. 1.
Figure 4:
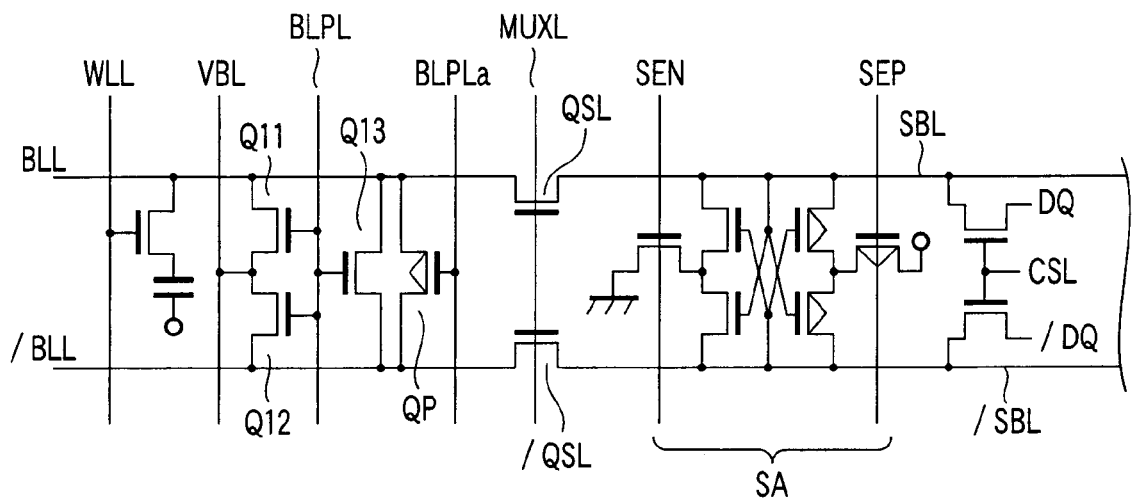
FIG. 4 is a schematic circuit diagram of another conventional DRAM which is different from the DRAM of FIG. 1.
Figure 5:
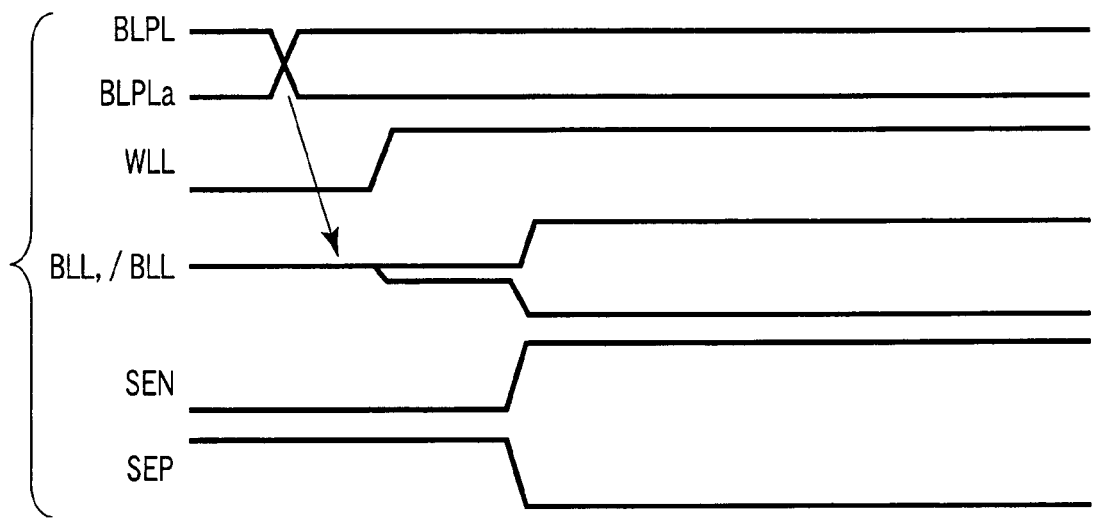
FIG. 5 is a signal waveform diagram in data reading operation in the DRAM of FIG. 4.

An embodiment of the present invention is explained below with reference to drawings. In the explanation, like reference numerals are assigned to like constituent elements through the drawings.

Figure 6:
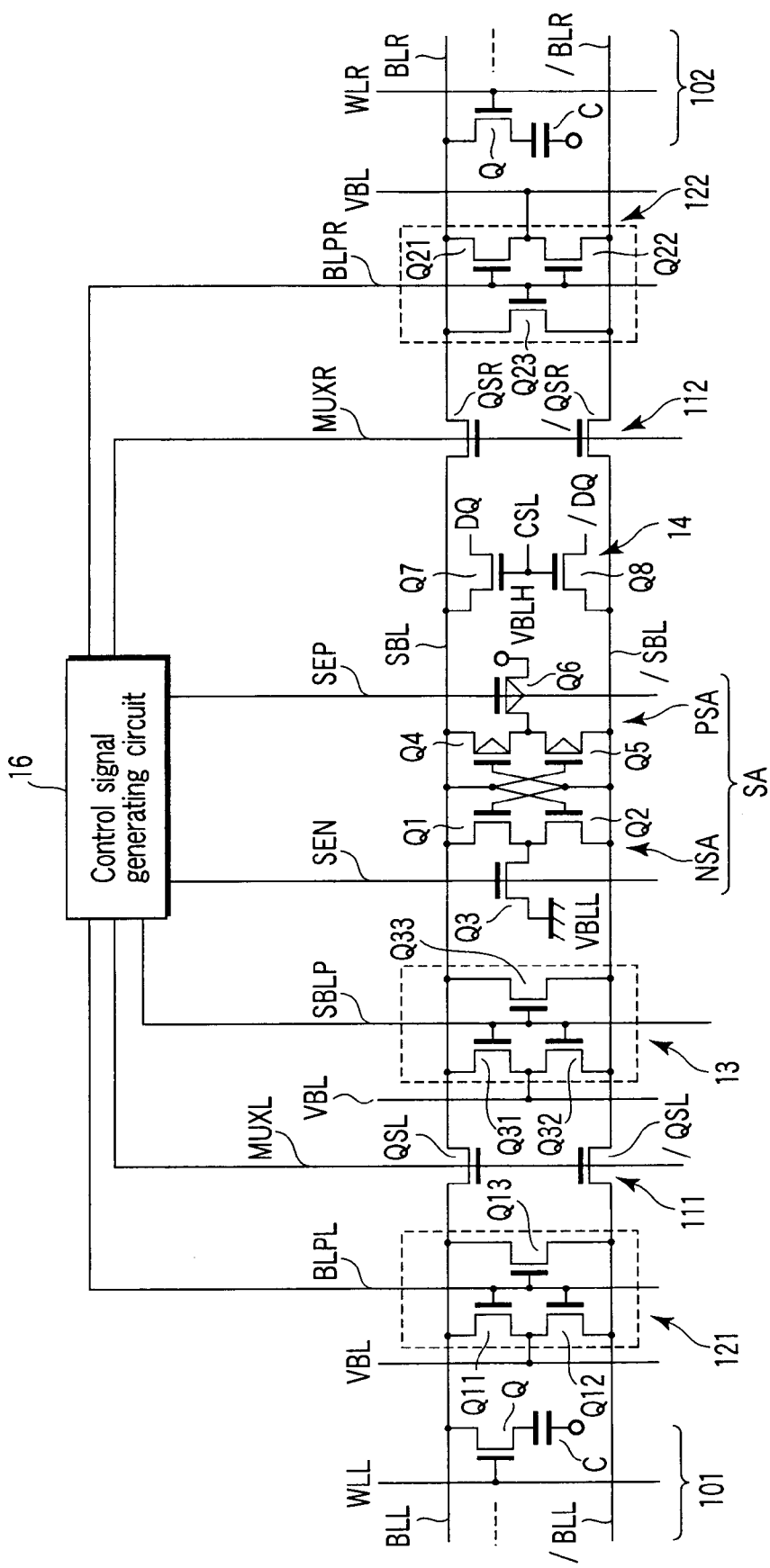
FIG. 6 is a schematic circuit diagram of a DRAM according to an embodiment of a semiconductor storage apparatus of the present invention.

FIG. 6 is a schematic circuit diagram of a DRAM according to an embodiment of a semiconductor storage apparatus of the present invention. The DRAM has cell arrays each being formed of memory cells each having one transistor and one capacitor. Further, the DRAM adopts a shared sense amplifier of the folded bit line scheme, in which a bit line sense amplifier is shared between cell arrays located on the left and right sides of the amplifier. FIG. 6 illustrates only a part of the structure, that is, only a pair of left and right columns.

In the DRAM, a first memory cell array (subarray) 101 and a second memory cell array (subarray) 102 are arranged on the left and right sides of a bit line sense amplifier SA for bit line potential detection and amplification. In this example, only one memory cell in one column is illustrated for each memory cell array, for simple illustration.

Each of the memory cell arrays 101 and 102 has a structure, in which memory cells are arranged in rows and columns, and each memory cell is formed by connecting a capacitor C for data storage with a transistor Q for charge transfer in series. In each row of the memory cell arrays, a common word line is connected to gates of the transistors Q of the same row. In each column of the memory cell arrays, a common bit line is connected to drains of transistors Q of the same column. One end of each capacitor C is connected to a source line. Each word line is supplied with a word line signal from a row decoder for word line.

A word line WLL is a first word line connected to the first memory cell array 101, and a word line WLR is a second word line connected to the second memory cell array 102.

BLL and /BLL denote a first cell array bit line pair connected to columns of the first memory cell array 101. BLR and /BLR denote a second cell array bit line pair connected to columns of the second memory cell array 102. SBL and /SBL denote a sense amplifier bit line pair connected to a pair of input/output nodes of the bit line sense amplifier SA.

Reference numeral 111 denotes a first cell array selection circuit which selectively connects the first cell array bit line pair BLL and /BLL with the sense amplifier bit line pair SBL and /SBL. The first cell array selection circuit 111 includes an N channel MOS transistor QSL, and an N channel MOS transistor /QSL. One of a source and a drain of the N channel MOS transistor QSL is connected to one cell array bit line BLL of the first cell array bit line pair BLL and /BLL, and the other of the source and the drain is connected to one sense amplifier bit line SBL of the sense amplifier bit line pair SBL and /SBL, and a gate electrode of the N channel MOS transistor QSL receives a cell array selection signal MUXL. One of a source and a drain of the N channel MOS transistor /QSL is connected to the other cell array bit line /BLL of the first cell array bit line pair BLL and /BLL, and the other of the source and the drain is connected to the other sense amplifier bit line /SBL of the sense amplifier bit line pair SBL and /SBL, and a gate electrode of the N channel MOS transistor /QSL receives the cell array selection signal MUXL.

Reference numeral 112 denotes a second cell array selection circuit which selectively connects the second cell array bit pair BLR and /BLR with the sense amplifier bit line pair SBL and /SBL. The second cell array selection circuit 112 includes an N channel MOS transistor QSR, and an N channel MOS transistor /QSR. One of a source and a drain of the N channel MOS transistor QSR is connected to one cell array bit line BLR of the second cell array bit line pair BLR and /BLR, and the other of the source and the drain is connected to one sense amplifier bit line SBL of the sense amplifier bit line pair SBL and /SBL, and a gate electrode of the N channel MOS transistor QSR receives a cell array selection signal MUXR. One of a source and a drain of the N channel MOS transistor /QSR is connected to the other cell array bit line /BLR of the second cell array bit line pair BLR and /BLR, and the other of the source and the drain is connected to the other sense amplifier bit line /SBL of the sense amplifier bit line pair SBL and /SBL, and a gate electrode of the N channel MOS transistor /QSR receives the cell array selection signal MUXR.

Reference numeral 121 is a first cell array bit line precharge circuit which precharges the first cell array bit line pair BLL and /BLL to a predetermined potential during a predetermined period. The first cell array bit line precharge circuit 121 has a pair of precharge MOS transistors Q11 and Q12, and a transistor Q13 for equalizing the bit line pair. One of a source and a drain of the MOS transistor Q11 is connected to one cell array bit line BLL of the first cell array bit line pair, the other of the source and the drain is connected to a precharge potential line VBL, and a bit line precharge signal BLPL is supplied to a gate electrode of the MOS transistor Q11. One of a source and a drain of the MOS transistor Q12 is connected to the other cell array bit line /BLL of the first cell array bit line pair, the other of the source and the drain is connected to the precharge potential line VBL, and the bit line precharge signal BLPL is supplied to a gate electrode of the MOS transistor Q12. One of a source and a drain of the MOS transistor Q13 is connected to one cell array bit line BLL of the first cell array bit line pair, the other of the source and the drain is connected to the other cell array bit line /BLL, and the bit line precharge signal BLPL is supplied to a gate electrode of the MOS transistor Q13. In the example, the precharge MOS transistors Q11 and Q12 and the equalizing MOS transistor Q13 are of the same conductivity type as that of the cell array selection MOS transistors QSL and /QSL, and are N channel transistors.

Reference numeral 122 is a second cell array bit line precharge circuit which precharges the second cell array bit line pair BLR and /BLR to a predetermined potential during a predetermined period. The second cell array bit line precharge circuit 122 has a pair of precharge MOS transistors Q21 and Q22, and a transistor Q23 for equalizing the bit line pair. One of a source and a drain of the MOS transistor Q21 is connected to one cell array bit line BLR of the second cell array bit line pair, the other of the source and the drain is connected to a precharge potential line VBL, and a bit line precharge signal BLPR is supplied to a gate electrode of the MOS transistor Q21. One of a source and a drain of the MOS transistor Q22 is connected to the other cell array bit line /BLR of the second cell array bit line pair, the other of the source and the drain is connected to the precharge potential line VBL, and the bit line precharge signal BLPR is supplied to a gate electrode of the MOS transistor Q22. One of a source and a drain of the MOS transistor Q23 is connected to one cell array bit line BLR of the second cell array bit line pair, the other of the source and the drain is connected to the other cell array bit line /BLR, and the bit line precharge signal BLPR is supplied to a gate electrode of the MOS transistor Q23. In the example, the precharge MOS transistors Q21 and Q22 and the equalizing MOS transistor Q23 are of the same conductivity type as that of the cell array selection MOS transistors QSR and /QSR, and are N channel transistors.

Furthermore, there is provided a sense amplifier bit line precharge circuit 13. The sense amplifier bit line precharge circuit 13 has precharge MOS transistors Q31 and Q32 which precharge the sense amplifier bit line pair SBL and /SBL to a predetermined potential for a predetermined period, and a MOS transistor Q33 for equalizing the bit line pair. One of a source and a drain of the MOS transistor Q31 is connected to one sense amplifier bit line SBL of the sense amplifier bit line pair SBL and /SBL, the other of the source and the drain is connected to a precharge potential line VBL, and a sense amplifier bit line precharge signal SBLP is supplied to a gate electrode of the MOS transistor Q31. One of a source and a drain of the MOS transistor Q32 is connected to the other sense amplifier bit line /SBL of the sense amplifier bit line pair, the other of the source and the drain is connected to the precharge potential line VBL, and the sense amplifier bit line precharge signal SBLP is supplied to a gate electrode of the MOS transistor Q32. One of a source and a drain of the MOS transistor Q33 is connected to one sense amplifier bit line SBL of the sense amplifier bit line pair, the other of the source and the drain is connected to the other sense amplifier bit line /SBL, and the sense amplifier bit line precharge signal SBLP is supplied to a gate electrode of the MOS transistor Q33. In the example, the precharge MOS transistors Q31 and Q32 and the equalizing MOS transistor Q33 are of the same conductivity type as that of the cell array selection MOS transistors QSL, /QSL, QSR and /QSR, and are N channel transistors.

The bit line sense amplifier SA has an N-channel sense amplifier NSA and a P-channel sense amplifier PSA for bit line potential sense amplification, each of which has a pair of input/output nodes connected to the sense amplifier bit line pair SBL and /SBL. The N-channel sense amplifier NSA has two N-channel MOS transistors Q1 and Q2 which perform sense amplification of the difference in potential between the sense amplifier bit line pair SBL and /SBL, and an N-channel MOS transistor Q3 for drive control. One ends of the sense-amplifying N-channel MOS transistors Q1 and Q2 are connected to the sense amplifier bit lines SBL and /SBL, respectively, and the other ends of the MOS transistors Q1 and Q2 are connected to each other. Gate electrodes of the MOS transistors Q1 and Q2 are connected to the respective sense amplifier bit lines located on the reverse side of the respective sense amplifier bit lines to which one ends of the respective MOS transistors Q1 and Q2 are connected. Further, the N-channel MOS transistor Q3 for drive control is connected between a common connecting node of the two sense-amplifying N-channel MOS transistors Q1 and Q2 and a VBLL node, and is switch-driven by an N-channel sense amplifier drive signal SEN.

The P-channel sense amplifier PSA has two P-channel MOS transistors Q4 and Q5, and a P-channel MOS transistor Q6 for drive control. One ends of the sense-amplifying P-channel MOS transistors Q4 and Q5 are connected to the sense amplifier bit lines SBL and /SBL, respectively, and the other ends of the MOS transistors Q4 and Q5 are connected to each other. Gate electrodes of the MOS transistors Q4 and Q5 are connected to the respective sense amplifier bit lines located on the reverse side of the respective sense amplifier bit lines to which one ends of the respective MOS transistors Q4 and Q5 are connected. Further, the P-channel MOS transistor Q6 for drive control is connected between a common connecting node of the two sense-amplifying P-channel MOS transistors Q4 and Q5 and a VBLH node, and is switch-driven by an P-channel sense amplifier drive signal SEP.

The control signals MUXL, MUXR, BLPL, BLPR, and SBLP are output from a control signal generating circuit 16. In a standby state of read/write operation for the memory cell arrays, the control signals MUXL and MUXR control the cell array selection circuits 111 and 112 to an inactive state (OFF state), respectively, the control signals BLPL and BLPR control the cell array bit line precharge circuits 121 and 122 to an active state (precharge state), respectively, and the control signal SBLP controls the sense amplifier bit line precharge circuit 13 to an active state (precharge state).

In comparison with this, in an active state of read/write operation for the memory cell arrays, one of the control signals MUXL and MUXR is controlled to change the cell array selection circuit 111 or 112 on the side of the cell array to be selected to an active state (ON state), one of the control signals BLPL and BLPR is controlled to change the precharge circuit 121 or 122 on the side of the cell array to be selected to an inactive state (OFF state, precharge release state), and the control signal SBLP is controlled to change the sense amplifier bit line precharge circuit 13 to an inactive state (OFF state, precharge release state). It suffices that the time ts (illustrated in FIG. 7) when the cell array selection transistors QSL and /QSL or QSR and /QSR are changed to the ON state is almost simultaneous with the time tc (illustrated in FIG. 7) when the transistors for precharging and equalizing the cell array bit lines and the transistors for precharging and equalizing the sense amplifier bit lines are changed to the OFF state. More strictly, the time ts is desirably later than the time tc.

In this embodiment, the relationship between the precharging and equalizing transistors Q11 to Q13 and Q21 to Q23 of the cell array bit line precharge circuits 121 and 122, the precharging and equalizing transistors Q31 to Q33 of the sense amplifier bit line precharge circuit 13, the control signals BLPL, BLPR and SBLP controlling the transistors and the cell array selection MOS transistors QSL, /QSL, QSR, and /QSR and the control signals MUXL and MUXR controlling the transistors is set as follows. Specifically, it is set such that the potential change (falling noise) which is provided in the cell array bit line pair on the selected cell array side and the sense amplifier bit line pair when the selected cell array bit line precharge and equalizing transistor and the sense amplifier bit line precharge and equalizing transistors change to an inactive state is reduced or canceled by the potential change (rising noise) which is provided in the cell array bit line pair on the selected cell array side and the sense amplifier bit line pair when the MOS transistors for selecting the selected cell array change to an active state.

As a specific example, the cell array bit line precharge and equalizing transistors Q11 to Q13 and Q21 to Q23, the cell array selection transistors QSL, /QSL, QSR, /QSR, and the sense amplifier bit line precharge and equalizing transistors Q31 to Q33 are of the same conductivity type, and are formed such that the gate insulating films thereof have the same film thickness. Further, the potential of the control signals MUXL and MUXR which controls the gate electrodes of the cell array selection transistors QSL, /QSL, QSR, and /QSR when the transistors are in the active state is set equal to the potential of the control signal BLPL, BLPR and SBLP which control the gate electrodes of the cell array bit line precharge and equalizing transistors Q11 to Q13 and Q21 to Q23 and the sense amplifier bit line precharge and equalizing transistors Q31 to Q33 when the transistors are in the active state. Furthermore, the potential of the control signal MUXL and MUXR which control the gate electrodes of the cell array selection transistors QSL, /QSL, QSR and /QSR when the transistors are in inactive state is set equal to the potential of the control signals BLPL, BLPR, and SBLP which control the gate electrodes of the cell array bit line precharge and equalizing transistors Q11 to Q13, and Q21 to Q23 and the sense amplifier bit line precharge and equalizing transistors Q31 and Q33 when the transistors are in the inactive state. Since the capacitance of the sense amplifier bit lines SBL and /SBL is smaller than the capacitance of the cell array bit lines BLL and /BLL or BLR and /BLR, the driving capacity of the sense amplifier bit line precharge and equalizing transistors Q31 to Q33 for driving the sense amplifier bit line capacity can be smaller than the driving capacity of the cell array bit line precharge and equalizing MOS transistors Q11 to Q13 or Q21 to Q23 for driving the cell array bit line capacity.

Further, there is provided a CSL gate circuit 14. The CSL gate circuit 14 is switched by a column selection signal CSL, and has two NMOS transistors Q7 and Q8 which selectively connect the sense amplifier bit line pair SBL and /SBL with a data line pair DQ and /DQ.

Figures 7, 8:
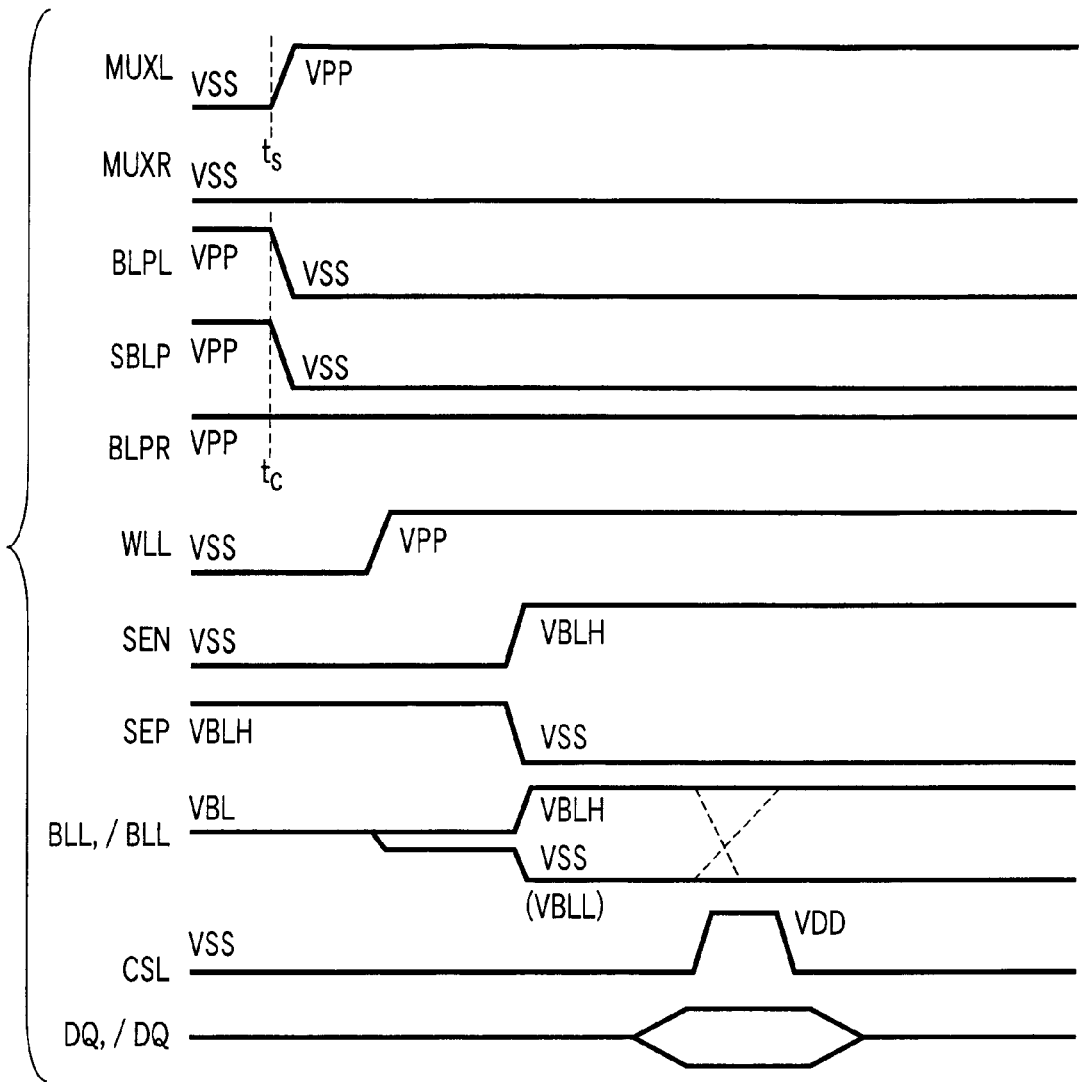
FIG. 7 is a signal waveform diagram in data reading operation in the DRAM of FIG. 6.
FIG. 8 is a diagram illustrating a result of simulation comparing property of the DRAM of FIG. 6 with property of the conventional DRAM.

FIG. 7 illustrates an example of a signal waveform of a main part of data reading operation in the DRAM of FIG. 6. In FIG. 7, VPP denotes an "H" level potential of a word line, VBLH denotes an "H" level potential of a bit line, VBLL (normally VSS) denotes a "L" level potential of a bit line, VBL (normally VBLH/2) denotes a precharge potential of a bit line, and VDD denotes a power potential of a peripheral logic circuit.

First, a general outline of data reading operation in the DRAM of FIG. 6 is explained. In the standby state (precharge period), the control signals MUXL and MUXR for the cell array selection transistors QSL, /QSL, QSR and /QSR are set to "L" level, and thereby the cell array selection transistors QSL, /QSL, QSR, and /QSR are set to the OFF state. Further, the control signals BLPL and BLPR for the cell array bit line precharge circuits 121 and 122 and the control signal SBLP for the sense amplifier bit line precharge circuit 13 are set to "H" level, and thereby the cell array bit lines BLL, /BLL, BLR, /BLR and the sense amplifier bit lines SBL and /SBL are set to the precharge state.

Next, in the active state, the control signal MUXL or MUXR for the cell array selection transistors QSL and /QSL or QSR and /QSR on the selected side is changed to "L" level to "H" level, and thereby the cell array selection transistors QSL and /QSL or QSR and /QSR are changed to the ON state. Simultaneously, the control signal BLPL or BLPR of the cell array bit line precharge and equalizing transistor Q11 to Q13 or Q21 to Q23 and the control signal SBLP of the sense amplifier bit line precharge and equalizing transistors Q31 to Q33 are changed to "H" level (precharge state) to "L" level (precharge release state). Thereby, falling noise which occurs in the cell array bit lines BLL and /BLL or BLR and /BLR with fall of the control signal BLPL or BLPR for the cell array bit line precharge and equalizing transistors and the control signal SBLP for the sense amplifier bit line precharge and equalizing transistors is canceled by rising noise which occurs in the cell array bit lines BLL and /BLL or BLR and /BLR and the sense amplifier bit lines SBL and /SBL with rise of the control signal MUXL or MUXR for the cell array selection transistors QSL and /QSL or QSR and /QSR.

The following is detailed explanation of an example of data reading operation in the DRAM of FIG. 6, with reference to FIG. 7. For example, reading operation is performed for the left cell array 101 in FIG. 6, the potential of the control signal BLPL for the precharge and equalizing transistors Q11 to Q13 which precharge and equalize the cell array bit line pair BLL and /BLL to VBL is changed from VPP to VSS, and thereby the precharge state of the BLL and /BLL is released. Further, the potential of the control signal SBLP for the precharge and equalizing transistors Q31 to Q33 which precharge the sense amplifier bit line pair SBL and /SBL to VBL is changed from VPP to VSS, and thereby the precharge state of SBL and /SBL is released. Then, the potential of the cell array selection signal MUXR is maintained at VSS, and the potential of the cell array selection signal MUXL is changed from VSS to VPP. Thereby, the left cell array 101 is selected, in the state where the right cell array 102 is electrically disconnected from the sense amplifier SA.

Thereafter, the potential of the word line WLL is changed from VSS to VPP, and data stored in the memory cells of the left cell array 101 is read onto the cell array bit line pair BLL and /BLL and the sense amplifier bit line pair SBL and /SBL. After a certain time interval, the potential of the NMOS driver transistor activating signal SEN for the sense amplifier SA is changed from VSS to VBLH, and the potential of the PMOS driver transistor activating signal SEP for the sense amplifier SA is changed from VBLH to VSS. Thereby, the data read onto the cell array bit line pair BLL and /BLL and the sense amplifier bit line pair SBL and /SBL is amplified, and the potential of bit lines on the "H" side among the bit line pair BLL and /BLL and the sense amplifier bit line pair SBL and /SBL is changed to VBLH, and the potential of the bit lines on the "L" side is changed to VSS. Thereafter, the potential of the column selection signal CSL of the CSL gate circuit 14 is activated from VSS to VDD, data of the sense amplifier bit line pair SBL and /SBL is transferred to the data line pair DQ and /DQ, and thereby reading is performed. In reverse to the above, writing is performed by transferring data of the data line pair DQ and /DQ to the sense amplifier bit line pair SBL and /SBL.

In the above operation, the potential of the cell array selection signals MUXL and MUXR is VSS in the standby state. In the active state, the control signal BLPL and SBLP simultaneously fall, the precharge operation for the cell array bit line pair BLL and /BLL and the sense amplifier bit line pair SBL and /SBL is released, and simultaneously the cell array selection signal MUXL rises. Therefore, both falling noise by the control signal BLPL and SBLP and rising noise by the cell array selection signal MUXL are provided on the cell array bit line pair BLL and /BLL and the sense amplifier bit line pair SBL and /SBL, and the potential just before the word line WL is activated is not greatly lowered from the bit line precharge potential VBL. Specifically, it is possible to use large size bit line precharge and equalizing transistors can be used for increase in the operation speed, and a reading margin of "0" data does not deteriorate.

The sense amplifier bit line precharge and equalizing transistors Q31 to Q33 are arranged in the vicinity of the sense amplifier SA. However, this causes no problem as long as the total gate width (channel width) of the transistors in the sense amplifier bit line precharge circuit 13 and the transistors in the two cell array bit line precharge circuits 121 and 122 is not much larger than the total gate width (channel width) of the transistors in the two bit line precharge circuits in the prior art of FIG. 1.

FIG. 8 illustrates a simulation result in which the gate width (channel width) size (Tr Size), the precharge time, the falling noise of the bit line equalizing transistors Q13, Q23 and Q33 of the bit line precharge circuits 121, 122 and 13 in the embodiment of FIG. 6 are compared with those of the conventional circuit of FIG. 1. In the comparison, the gate width (channel width) of the precharge transistors Q11, Q12, Q21, Q22, Q31 and Q32 of the bit line precharge circuits 121, 122 and 13 is set to 0.2 µm, VPP is set to 2.8V, VBLH is set to 1.2V, VBL is set to 0.6V (=VBLH/2), and VSS is set to 0V.

As is clear from FIG. 8, in the conventional art, when the gate width (channel width) of the bit line equalizing transistors is 4.0 µm, the precharge time is 1.6 nS, and the falling noise is 170 mV. In comparison with this, in the embodiment, when the gate width (channel width) of the cell array bit line equalizing transistors Q13 and Q23 is 1.5 µm and the gate width (channel width) of the sense amplifier equalizing transistor Q33 is 0.5 µm, the precharge time is greatly reduced to 1.0 nS, and the falling noise is greatly reduced to 30 mV. Therefore, according to the present embodiment, high-speed precharge operation is achieved with low noise. Further, the gate widths (channel width) of the transistors Q13, Q23 and Q33 in the embodiment are smaller than the gate width (channel width) of the transistors in the conventional apparatus. In the conventional apparatus, it is necessary to precharge the sense amplifier bit line pair through the cell array selection transistors. In the present embodiment, the cell array bit line pair and the sense amplifier bit line pair are independently precharged. Therefore, high-speed precharge is achieved without much increasing the size of each transistor in the precharge circuits.

Therefore, according to the DRAM of FIG. 6, high-speed and low-noise precharge operation is achieved, and the layout size of the sense amplifier is reduced.

<Circuit Configuration of the DRAM>

Figure 9:
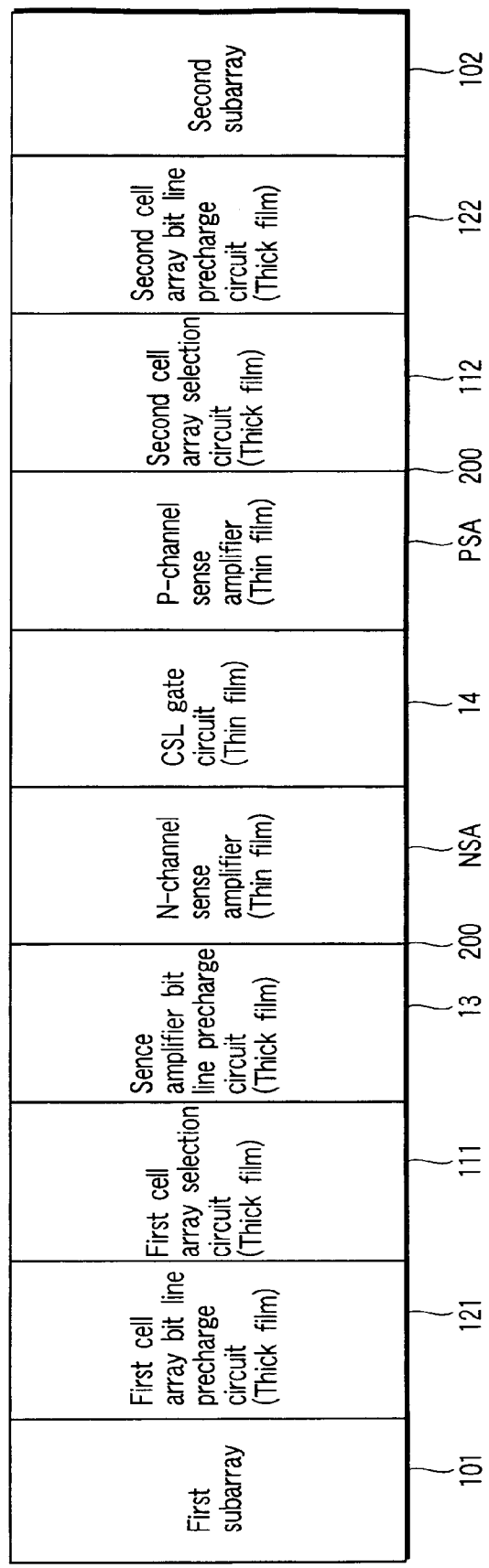
FIG. 9 is a plan view illustrating an example of a circuit configuration in the DRAM of FIG. 6.

FIG. 9 schematically illustrates an example of circuit configuration of the DRAM according to the present embodiment. The arranging area of the sense amplifier bit line precharge circuit 13 is adjacent to the arranging area of the left cell array selection circuit 111, as illustrated in FIG. 9. As another example, the sense amplifier bit line precharge circuit 13 may be adjacent to the arranging area of the right cell array selection circuit 112.

As described above, transistors having a thin gate oxide film are used as transistors forming the sense amplifier SA (NSA, PSA) and transistors forming the CSL gate circuit 14, from the viewpoint of increase in speed. Transistors having a thick gate oxide film are used as transistors forming the cell array selection circuits 111 and 112 and transistors forming the bit line precharge circuits 121 and 122.

In consideration of layout, arranging transistors having different gate oxide film thicknesses adjacent to each other requires a space larger than the space between the transistors (isolation region) required in the case where transistors having the same gate oxide film thickness are arranged adjacent to each other. Therefore, if transistors forming the sense amplifier bit line precharge circuit 13 are disposed between the CSL gate circuit 14 and the PMOS sense amplifier PSA, it is necessary to provide large spaces on the both sides of the sense amplifier bit line precharge circuit 13. In comparison with the above arrangement, as illustrated in FIG. 9, when the transistors forming the sense amplifier bit line precharge circuit 13 is disposed in an area adjacent to transistors forming the cell array selection circuit 111 or 112, the number of boundaries (denoted by reference numeral 200 in FIG. 9) between transistors having different gate oxide film thicknesses is not increased. This suppresses increase in the area caused by arrangement of transistors forming the sense amplifier bit line precharge circuit 13 to a minimum.

Although the above embodiment describes the case where the present invention is applied to a DRAM, the present invention can also be applied to other semiconductor storage apparatuses, as long as the semiconductor storage apparatus has a structure in which bit lines are precharged to a certain potential, and data transmitted from memory cells to a bit line pair in data reading is sensed and latched by a sense amplifier.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage apparatus comprising:
   a memory cell array formed by arranging a plurality of memory cells in rows and columns;
   a cell array bit line pair which is provided for each column of the memory cell array, and connected to a plurality of memory cells of the column;
   a bit line sense amplifier which senses a potential of the cell array bit line pair;
   a sense amplifier bit line pair connected to the bit line sense amplifier;
   a cell array selection circuit which has a pair of transistors each having a gate electrode receiving a first control signal, the cell array selection circuit being connected between the cell array bit line pair and the sense amplifier bit line pair, and selectively connecting the cell array bit line pair and the sense amplifier bit line pair;
   a first precharge circuit which includes at least one transistor having the same conductivity type as that of the pair of transistors in the cell array selection circuit, and precharges and equalizes the cell array bit line pair, said at least one transistor having a gate electrode receiving a second control signal;
   a second precharge circuit which includes at least one transistor having the same conductivity type as that of the pair of transistors in the cell array selection circuit, and precharges and equalizes the sense amplifier bit line pair, said at least one transistor having a gate electrode receiving a third control signal; and
   a control signal generating circuit which generates the first, the second, and the third control signals, supplies the first, the second, and the third control signals to the cell array selection circuit, the first precharge circuit and the second precharge circuit, respectively, controls the cell array selection circuit to an inactive state and controls the first and the second precharge circuits to an active state in a standby state of read/write operation for the memory cell array, and controls the cell array selection circuit to an active state and controls the first and the second precharge circuits to an inactive state in an active state of read/write operation for the memory cell array.

2. A semiconductor storage apparatus according to claim 1, wherein the pair of transistors in the cell array selection circuit, said at least one transistor in the first precharge circuit, said at least one transistor in the second precharge circuit, and the first, the second, and the third control signals are set in which a change in potential which is provided to the cell array bit line pair and the sense amplifier bit line pair when said at least one transistor in the first precharge circuit and said at least one transistor in the second precharge circuit change from ON state to OFF state is canceled by a change in potential which is provided to the cell array bit line pair and the sense amplifier bit line pair when the pair of transistors in the cell array selection circuit change from OFF state to ON state.

3. A semiconductor storage apparatus according to claim 1, wherein the control signal generating circuit generates the first, the second, and the third control signals in which a potential of the first control signal when the pair of transistors in the cell array selection circuit is in the ON state is equal to a potential of the second control signal when said at least one transistor in the first precharge circuit is in the ON state, and a potential of the third control signal when said at least one transistor in the second precharge circuit is in the ON state, and the potential of the first control signal when the pair of transistors in the cell array selection circuit is in the OFF state is equal to the potential of the second control signal when said at least one transistor in the first precharge circuit is in the OFF state, and the potential of the third control signal when said at least one transistor in the second precharge circuit is in the OFF state.

4. A semiconductor circuit according to claim 1, wherein a device size of said at least one transistor in the second precharge circuit is smaller than a device size of said at least one transistor in the first precharge circuit.

5. A semiconductor storage apparatus according to claim 1, wherein each of the pair of transistors in the cell array selection circuit, said at least one transistor in the first precharge circuit, and said at least one transistor in the second precharge circuit is formed of a MOS transistor having a gate insulating film, and the gate insulating films of the MOS transistors have an equal thickness, the bit line sense amplifier has a plurality of MOS transistors each having a gate insulating film, the thickness of the gate insulating films of the pair of MOS transistors in the cell array selection circuit, said at least one MOS transistor in the first precharge circuit, and said at least one MOS transistor in the second precharge circuit is larger than thickness of the gate insulating films of the MOS transistors in the bit line sense amplifier.

6. A semiconductor storage apparatus according to claim 1, wherein arranging areas of the first precharge circuit, the cell array selection circuit, and the second precharge circuit are successively located adjacent to each other, and an arranging area of the bit line sense amplifier is located adjacent to an arranging area of the second precharge circuit.

7. A semiconductor storage apparatus according to claim 1, wherein the cell array selection circuit includes:

a first N-channel MOS transistor having a source, a drain and a gate electrode, one of the source and the drain being connected to one cell array bit line of the cell array bit line pair, the other of the source and the drain being connected to one sense amplifier bit line of the sense amplifier bit line pair, and the gate electrode receiving the first control signal; and a second N-channel MOS transistor having a source, a drain, and a gate electrode, one of the source and the drain being connected to the other cell array bit line of the cell array bit line pair, the other of the source and the drain being connected to the other sense amplifier bit line of the sense amplifier bit line pair, and the gate electrode receiving the first control signal.

8. A semiconductor storage apparatus according to claim 1, wherein the first precharge circuit includes:

a third N-channel MOS transistor having a source, a drain and a gate electrode, one of the source and the drain being connected to one cell array bit line of the cell array bit line pair, the other of the source and the drain being connected to a first precharge potential line, and the gate electrode receiving the second control signal;

a fourth N-channel MOS transistor having a source, a drain, and a gate electrode, one of the source and the drain being connected to the other cell array bit line of the cell array bit line pair, the other of the source and the drain being connected to the first precharge potential line, and the gate electrode receiving the second control signal; and a fifth N-channel MOS transistor having a source, a drain, and a gate electrode, one of the source and the drain being connected to said one cell array bit line of the cell array bit line pair, the other of the source and the drain being connected to the other cell array bit line of the cell array bit line pair, and the gate electrode receiving the second control signal.

9. A semiconductor storage apparatus according to claim 1, wherein the second precharge circuit includes:

a sixth N-channel MOS transistor having a source, a drain and a gate electrode, one of the source and the drain being connected to one sense amplifier bit line of the sense amplifier bit line pair, the other of the source and the drain being connected to a second precharge potential line, and the gate electrode receiving a third control signal;

a seventh N-channel MOS transistor having a source, a drain, and a gate electrode, one of the source and the drain being connected to the other sense amplifier bit line of the sense amplifier bit line pair, the other of the source and the drain being connected to the second precharge potential line, and the gate electrode receiving the third control signal; and an eighth N-channel MOS transistor having a source, a drain, and a gate electrode, one of the source and the drain being connected to said one sense amplifier bit line of the sense amplifier bit line pair, the other of the source and the drain being connected to the other sense amplifier bit line of the sense amplifier bit line pair, and the gate electrode receiving the third control signal.

10. A semiconductor storage apparatus according to claim 1, wherein the bit line sense amplifier includes:
an N-channel sense amplifier having a pair of input and output nodes, the pair of input and output nodes being connected to the sense amplifier bit line pair; and
a P-channel sense amplifier having a pair of input and output nodes, the pair of input and output nodes being connected to the sense amplifier bit line pair.

11. A semiconductor storage apparatus according to claim 1, wherein each of the memory cells includes a data storage capacitor, and a charge transferring transistor connected to the capacitor in series.

12. A semiconductor storage apparatus comprising:
a first and a second memory cell arrays each being formed by arranging a plurality of memory cells in rows and columns;
a first cell array bit line pair which is provided for each column of the first memory cell array, and connected to a plurality of memory cells of the column;
a second cell array bit line pair which is provided for each column of the second memory cell array, and connected to a plurality of memory cells of the column;
a bit line sense amplifier which is provided for the columns of the first and second memory cell arrays, and senses a potential of the first or second cell array bit line pair;
a sense amplifier bit line pair connected to the bit line sense amplifier;
a first cell array selection circuit which is connected between the first cell array bit line pair and the sense amplifier bit line pair, and selectively connects the first cell array bit line pair and the sense amplifier bit line pair;
a second cell array selection circuit which is connected between the second cell array bit line pair and the sense amplifier bit line pair, and selectively connects the second cell array bit line pair and the sense amplifier bit line pair;
a first precharge circuit which includes at least one transistor having the same conductivity type as that of a pair of transistors in the first cell array selection circuit, and precharges and equalizes the first cell array bit line pair;
a second precharge circuit which includes at least one transistor having the same conductivity type as that of a pair of transistors in the second cell array selection circuit, and precharges and equalizes the second cell array bit line pair; and
a third precharge circuit which includes at least one transistor having the same conductivity type as that of the pairs of transistors in the first and the second cell array selection circuits, and precharges and equalizes the sense amplifier bit line pair.

13. A semiconductor storage apparatus according to claim 12, wherein a device size of said at least one transistor in the third precharge circuit is smaller than a device size of said at least one transistor in the first or second precharge circuit.

14. A semiconductor storage apparatus according to claim 12, wherein each of the pairs of transistors in the first and the second cell array selection circuits, said at least one transistors in the first and the second precharge circuits, and said at least one transistor in the third precharge circuit is formed of a MOS transistor having a gate insulating film, and the gate insulating films of the MOS transistors have an equal thickness, the bit line sense amplifier has a plurality of MOS transistors each having a gate insulating film, and the thickness of the gate insulating films of the pair of MOS transistors in the first and the second cell array selection circuits, said at least one MOS transistors in the first and the second precharge circuits, and said at least one MOS transistor in the third precharge circuit is larger than thickness of the gate insulating films of the MOS transistors in the bit line sense amplifier.

15. A semiconductor storage apparatus according to claim 12, wherein an arranging area of the first precharge circuit is adjacent to an arranging area of the first cell array selection circuit, an arranging area of the second precharge circuit is adjacent to an arranging area of the second cell array selection circuit, an arranging area of the third precharge circuit is adjacent to the arranging area of the first cell array selection circuit or the arranging area of the second cell array selection circuit, and an arranging area of the bit line sense amplifier is adjacent to the arranging area of the third precharge circuit.

16. A semiconductor storage apparatus comprising:
a first and a second memory cell arrays each being formed by arranging a plurality of memory cells in rows and columns;
a first cell array bit line pair which is provided for each column of the first memory cell array, and connected to a plurality of memory cells of the column;
a second cell array bit line pair which is provided for each column of the second memory cell array, and connected to a plurality of memory cells of the column;
a bit line sense amplifier which is provided for the columns of the first and second memory cell arrays, and senses a potential of the first or second cell array bit line pair;
a sense amplifier bit line pair connected to the bit line sense amplifier;
a first cell array selection circuit which has a pair of transistors each having a gate electrode receiving a first control signal, the first cell array selection circuit being connected between the first cell array bit line pair and the sense amplifier bit line pair, and selectively connects the first cell array bit line pair and the sense amplifier bit line pair;
a second cell array selection circuit which has a pair of transistors each having a gate electrode receiving a second control signal, the second cell array selection circuit being connected between the second cell array bit line pair and the sense amplifier bit line pair, and selectively connects the second cell array bit line pair and the sense amplifier bit line pair;
a first precharge circuit which includes at least one transistor having the same conductivity type as that of the pair of transistors in the first cell array selection circuit, and precharges and equalizes the first cell array bit line pair, said at least one transistor having a gate electrode receiving a third control signal;
a second precharge circuit which includes at least one transistor having the same conductivity type as that of the pair of transistors in the second cell array selection circuit, and precharges and equalizes the second cell array bit line pair, said at least one transistor having a gate electrode receiving a fourth control signal;
a third precharge circuit which includes at least one transistor having the same conductivity type as that of the pairs of transistors in the first and the second cell array selection circuits, and precharges and equalizes the sense amplifier bit line pair, said at least one transistor having a gate electrode receiving a fifth control signal; and a control signal generating circuit which generates the first, the second, the third, the fourth, and the fifth control signals, supplies the first, the second, the third, the fourth, and the fifth control signals to the first and the second cell array selection circuits, and the first, the second, and the third precharge circuits, respectively, controls the first and the second cell array selection circuits to an inactive state and controls the first, the second and the third precharge circuits to an active state in a standby state of read/write operation for the first and the second memory cell arrays, and controls one of the first and the second cell array selection circuits to an active state, the other to an inactive state, and controls the first, the second and the third precharge circuits to an inactive state in an active state of read/write operation for the first and the second memory cell arrays.

17. A semiconductor storage apparatus according to claim 16, wherein the pairs of transistors in the first and the second cell array selection circuits, said at least one transistors in the first and the second precharge circuits, said at least one transistor in the third precharge circuit, and the first, the second, the third, the fourth, and the fifth control signals are set in which a change in potential which is provided to the cell array bit line pair and the sense amplifier bit line pair when said at least one transistors in the first and the second precharge circuits and said at least one transistor in the third precharge circuit change from ON state to OFF state is canceled by a change in potential which is provided to the cell array bit line pair and the sense amplifier bit line pair when the pair of transistors in the first or the second cell array selection circuit changes from OFF state to ON state.

18. A semiconductor storage apparatus according to claim 16, wherein the control signal generating circuit generates the first, the second, the third, the fourth, and the fifth control signals in which a potential of the first or the second control signal when the pair of transistors in the first or the second cell array selection circuit is in the ON state is equal to a potential of the third or the fourth control signal when said at least one transistor in the first or the second precharge circuit is in the ON state, and a potential of the fifth control signal when said at least one transistor in the third precharge circuit is in the ON state, and the potentials of the first and the second control signals when the pairs of transistors in the first and the second cell array selection circuits are in the OFF state is equal to the potentials of the third and the fourth control signals when said at least one transistors in the first and the second precharge circuits are in the OFF state, and the potential of the fifth control signal when said at least one transistor in the third precharge circuit is in the OFF state.

19. A semiconductor circuit according to claim 16, wherein a device size of said at least one transistor in the third precharge circuit is smaller than a device size of said at least one transistor in the first or the second precharge circuit.

20. A semiconductor circuit according to claim 16, wherein each of the pairs of transistors in the first and the second cell array selection circuits, said at least one transistors in the first and the second precharge circuits, and said at least one transistor in the third precharge circuit is formed of a MOS transistor having a gate insulating film, and the gate insulating films of the MOS transistors have an equal thickness, the bit line sense amplifier has a plurality of MOS transistors each having a gate insulating film, and the thickness of the gate insulating films of the pair of MOS transistors in the first and the second cell array selection circuits, said at least one MOS transistors in the first and the second precharge circuits, and said at least one MOS transistor in the third precharge circuit is larger than thickness of the gate insulating films of the MOS transistors in the bit line sense amplifier.

* * * * *